United States Patent [19]
Fujita

[11] Patent Number: 6,122,206
[45] Date of Patent: Sep. 19, 2000

[54] SEMICONDUCTOR MEMORY DEVICE HAVING MEANS FOR OUTPUTTING REDUNDANCY REPLACEMENT SELECTION SIGNAL FOR EACH BANK

[75] Inventor: Mamoru Fujita, Tokyo, Japan

[73] Assignee: NEC Corporation, Tokyo, Japan

[21] Appl. No.: 09/262,257

[22] Filed: Mar. 4, 1999

[30] Foreign Application Priority Data

Mar. 16, 1998 [JP] Japan .................................. 10-065468

[51] Int. Cl.[7] .................................................. G11C 7/00
[52] U.S. Cl. ...................... 365/200; 365/222; 365/225.7; 365/230.03
[58] Field of Search .............................. 365/200, 230.03, 365/222, 225.7, 230.01, 189.01

[56] References Cited

U.S. PATENT DOCUMENTS

| 5,796,664 | 8/1998 | Tsuruda et al. ......................... 365/200 |
| 5,808,948 | 9/1998 | Kim et al. ............................... 365/201 |
| 5,822,257 | 10/1998 | Ogawa .................................... 365/200 |

*Primary Examiner*—David Nelms
*Assistant Examiner*—Hoai V. Ho
*Attorney, Agent, or Firm*—Scully, Scott, Murphy & Presser

[57] ABSTRACT

A semiconductor memory device having redundant memory selection circuit XRDN which outputs a redundant replacement selection signal for each bank. In a refreshing operation, each redundant decoder XRED only compares an address indicated by row address signal XADD with an address of a defective memory cell stored, without referring to a bank selection signal included in row address signal XADD. Redundant memory cell selection circuit XRDN outputs redundant replacement selection signals XRDNS (A), (B) for respective banks A, B, for indicating a bank in which the replacement is to be performed with a redundant memory cell.

8 Claims, 17 Drawing Sheets

SEMICONDUCTOR MEMORY DEVICE HAVING MEANS FOR OUTPUTTING REDUNDANCY REPLACEMENT SELECTION SIGNAL FOR EACH BANK

BACKGROUND OF THE INVENTION

1. Field of the Invention

The present invention relates to a semiconductor memory device and more particularly to a semiconductor memory device with remedying means for defective memory cells.

2. Description of the Related Art

A semiconductor memory device such as a DRAM (Dynamic Random Access Memory) is provided with respective memory cells at intersection points of a plurality of pairs of bit lines and a plurality of word lines. In this semiconductor memory device, the word line is selected with a row address and the pair of bit lines is selected with a column address to thereby allow the stored information of an intended memory cell to be read.

A conventional semiconductor memory device such as a DRAM employs a scheme of dividing a storage area into a plurality of blocks for an increased storage capacity or due to limitations on the length of the pair of bit lines.

For reading stored information stored in a memory cell of a semiconductor memory device comprising such a plurality of blocks, a row address is first specified, then a column address is specified and a block address must be specified. After the addresses are specified, a command is provided from the outside, thereby performing various operations such as data writing or reading.

However, even if the semiconductor memory device comprises a plurality of blocks as described above, there exists a problem that an increased storage capacity and an increased number of blocks require a long time for reading the stored content when one block cannot be processed while another block is being processed.

For solving this problem, a synchronous DRAM and the like have come into use in which memory cells are divided into banks which can operate independent of each other, not dividing the memory cells into a plurality of blocks.

Within each bank, a group of memory cells specified with an address signal applied from the outside are activated. At this time, respective banks can be simultaneously in an activated state. The addresses of the group of memory cells to be activated are independent among the respective banks.

FIG. 1 shows a configuration of a conventional semiconductor memory device comprising such a plurality of banks.

In this figure, description is made assuming that the number of banks is two [bank A (ARRAY0) and bank B (ARRAY1)], the number of subarrays forming each bank is four (SA00 to SA03, SA10 to SA13, respectively), and the number of subword lines (not shown) included in each subarray is 512. Also, description is made here by using a hierarchy word lines structure. In this case, the number of the subword lines are eight for one main word line MWL. Thus, the row address of each bank comprises 11 bits (X0 to X10). Each subarray in each bank is identified by X9, X10, each main word line in each subarray is identified by X3 to X8, and each of eight subword line for one main word line is identified by X0 to X2.

The replacement of a defective memory cell with a redundant memory cell is performed by two row addresses designated by X0. Each subarray has one redundant main word line RMWL (Redundant MWL) and eight subword lines connected thereto.

FIG. 2a and FIG. 2b show timing charts illustrating the operation of this conventional semiconductor memory device. FIG. 2a is a timing chart when the redundant memory cell is selected, while FIG. 2b is a timing chart when the redundant memory cell is not selected. ACT in FIG. 2a and FIG. 2b denotes a signal indicating that a bank corresponding to each ACT is in an activated state, and is generated by a command decoder (not shown) and the like in response to a command input from the outside.

In FIG. 1, XADD comprising 11 bits is a row address signal and is fetched from the outside in accordance with ACT signal by an address buffer (not shown). XABF denotes a row address signal buffer circuit and generates complementary signals X1N to X10N, X1T to X10T in accordance with X1 to X10 within row address signals XADD. Respective redundant decoders XRED are circuits which store respective defective addresses to be replaced and perform storage/comparison for defective addresses.

FIG. 3 is a circuit diagram showing an example of redundant decoder XRED as described above. Redundant decoder XRED compares row address signal XADD and the defective address stored therein.

In this conventional semiconductor memory device, the replacement is made with two subword lines as a unit, so that X1 to X10 making up row address signal XADD are stored. Subword lines designated by X0, for example row address 0 and row address 1 are not distinguished within redundant decoder XRED and are determined as defective addresses when either of them is applied to redundant decoder XRED. In redundant decoder XRED, the replacement address is stored by disconnecting either of fuses F1N to F10N or F1T to F10T. Although the way of disconnecting the fuse is not particularly limited, fusion with laser beam is commonly used. Disconnection of either FnN or FnT causes one bit of the replacement address to be stored. For example, when the relevant bit in the replacement address is 0 or 1, F1N to F10N are disconnected and F1T to F10T are not disconnected.

Next, the operation of redundant decoder XRED will be described. First, all of row address signal XADD go to a low level and redundant precharge signal PXR goes to a low level, thereby causing node 100 to go to a high level. Subsequently, based on an address signal applied from the outside, the states X1N to X10N and X1T and X10T are set within the complementary signals of 11 bits making up row address signal XADD. At this time, since XnN and XnT (n=1 to 10) are complementary signals, one of them is at a high level and the other is at a low level. For example, when the row address is 0 or 1, X1N to X10N are at a high level and X1T to X10T are at a low level. Thus, node 100 and node 101 are rendered conductive unless the replacement address stored in fuses FnN, FnT and row address signal XADD match.

Node 100 goes to a low level when redundant precharge signal PXR goes to a high level and the replacement address and row address signal XADD do not match, and node 100 remains at a high level when they match. Level at node 100 is held at node 102 in response to latch signal XLAT and outputted as defective address match signal XREBL. FIG. 2a shows a case where the replacement address and row address signal XADD match and defective address match signal XREBL at a high level is outputted. FIG. 2b shows a case where the replacement address and row address signal XADD do not match and defective address match signal XREBL at a low level is outputted.

When ACT signal goes to a low level, all defective address match signals XREBL are made unselected in response to XPRE signal as shown in FIG. 2a and FIG. 2b, and therefore the selected redundant memory cell is made unselected.

FIG. 4 is a circuit diagram showing an example of redundant memory cell selection circuit XRDN. Redundant memory cell selection circuit XRDN exists on a one-to-one basis for each redundant row decoder RXDC. Since one redundant decoder XRED exists for two subword lines, one redundant memory cell selection circuit XRDN exists for four redundant decoders XRED. This ratio is equal to the ratio of the number of the main word lines to the number of the subword lines. Redundant memory cell selection circuit XRDN, when one of four defective address match signals XREBL connected thereto goes to a high level, causes redundant replacement selection signal XRDNS set at a high level by a precharge circuit (not shown) to be pulled down to a low level. Redundant replacement selection signal XRDNS is a signal indicating that the redundant memory cell has been selected. Also, redundant memory cell selection circuit XRDN causes redundant row decoder selection signal RXDS to go to at a high level, and activates redundant row decoder RXDC connected on a one-to-one basis.

Additionally, redundant subword line selection signals RRAIS1, RRAIS2, set at a high level by a precharge circuit (not shown), are selectively pulled down to a low level in response to defective address match signal XREBL. RRAIS1, RRAIS2 are not pulled down to a low level when XREBL0 goes to a high level among four defective address match signals XREBL0 to XREBL3 connected to the redundant memory cell selection circuit XRDN. However, only RRAIS1 is pulled down when XREBL1 goes to a high level, only RRAIS2 is pulled down when XREBL2 goes to a high level, and both of redundant subword line selection signals RRAIS1, RRAIS2 are pull down when XREBL3 goes to a high level. Therefore, the comparison result in redundant decoder XRED matches the state of redundant subword line selection signal RRAIS signal.

Redundant decoder XRED and redundant memory cell selection circuit XRDN are fixed with respect to a bank to which each of them belongs and operate only when the relevant bank is selected. Also, each signal of redundant precharge signal PXR, latch signal XLAT, XPRE, redundant row decoder selection signal RXDS, redundant replacement selection signal XRDNS exists independently for each bank and operates independently.

XPR in FIG. 1 denotes a row address predecoder which generates row address predecode signal PXADD from row address signal XADD, as shown in FIG. 2a and FIG. 2b. It is to be noted that row address predecode signal PXADD comprises eight signals including X3N, 4N, 5N to X3T, 4T, 5T obtained through predecoding X3 to X5, eight signals including X6N, 7N, 8N to X6T, 7T, 8T obtained through predecoding X6 to X8, and four signals including X9N, 10N to X9T, 10T obtained through predecoding X9, X10. Eight signals including X3T, 4T, 5T and so on and eight signals including X6T, 7T, 8T and so on are used for selecting row decoder XDEC in each subarray, while four signals including X9T, 10T and so on are used for selecting the subarray in SXC circuit. Row predecode address signal PXADD is delayed within row address decode circuit XPR in order to wait for determination whether the redundant memory cell is selected or not, and latched by latch signal XLAT signal. When ACT signal goes to a low level, all row predecode address signals PXADD are made unselected by XPRE signal. As a result, the selected memory cell is made unselected.

FIG. 5 is a circuit diagram showing an example of subarray selection circuit SXC. When row address signal XADD does not match any of the redundant defective replacement addresses stored in redundant decoders XRED and redundant row decoder selection signal RXDS remains at a high level, subarray selection circuit SXC activates a sense amplifier array, (not shown) included in the relevant subarray, and activates subarray selection signal BSEL, based on row predecode address signal PXADD (X9,X10).

When row address signal XADD matches any one of the defective replacement addresses stored in redundant decoders XRED and redundant row decoder selection signal RXDS goes to a low level, subarray selection circuit SXC activates a sense amplifier array based on redundant replacement selection signal XRDNS and activates subarray selection signal BSED. At this time, when the subarray indicated by row predecode address signal PXADD and the subarray indicated by redundant replacement selection signal XRDNS do not match, the redundant main word line and the sense amplifier array within the subarray indicated by row predecode address signal PXADD are inhibited to be activated. In any case, the sense amplifier array to be activated is included in the subarray containing the activated word line.

FIG. 6 is a circuit diagram showing an example of row decoder XDEC. Row decoder XDEC activates main word line MWL based on row predecode address signal PXADD (X3 to X8) and subarray selection signal BSEL. However, when row address signal XADD matches any one of the replacement addresses stored in redundant decoders XRED and the redundant row decoder selection signal goes to a low level, the activation will not be performed.

FIG. 7 is a circuit diagram showing an example of redundant row decoder RXDC. When row address signal XADD matches any of the replacement addresses stored in redundant decoders XRED, redundant row decoder RXDC will activate the corresponding redundant main word line RMWL based on redundant replacement selection signal XRDNS. Thus, a main word line including a defective address will be replaced with a redundant main word line.

FIG. 8 is a circuit diagram showing an example of subword line selection circuit RAIS. When row address signal XADD does not match any of the defective replacement addresses of redundant decoders XRED and redundant row decoder selection signal RXDS is at a high level, subword line selection circuit RAIS will activate only one of subword line selection signals RAI0 to RAI7 in accordance with row address signal XADD (X0 to X2). On the other hand, when row address signal XADD matches one of the defective replacement addresses of redundant decoders XRED and redundant row decoder selection signal RXDS is at a low level, redundant subword line selection signal RRAIS1 instead of X1 of row address signal XADD, redundant subword line selection signal RRAIS2 instead of X2, and X0 of row address signal XADD are used to select one of subword line selection signals RAI0 to RAI7. Main word line MWL and subword line selection signal RAI are applied to a subword driver circuit (not shown), and an AND logic of these signals is used to select subword line SWL. Subword line SWL is directly connected to the memory cell to activate the memory cell.

As described above, in this prior art, the relationship of redundant decoder XRED, the main word line activated thereby, and subword line selection signal RAI is fixed, which results in a fixed relationship of each redundant decoder XRED and the subword line. Also, the number of the subword lines (two in this case) to which one redundant decoder XRED is responsible for replacement is also fixed.

In this case, there exist four redundant main word lines per bank and 32 relevant subword lines. 16 redundant decoders XRED exist within one bank. Since the replacement by one redundant decoder XRED is performed with two subword lines having an address only differing in X0 as a unit, up to 16 defective points per bank can be remedied if each of all defective points has either only one row address or two addresses only differing in X0.

However, if each defective point does not have two addresses only differing in X0, for example if the main word line (corresponding to eight subword lines having an address only differing in X0 to X2) is defective, four redundant decoders XRED are used for replacement with eight subword lines. In this case, 16 redundant decoders XRED per bank can be used to remedy four main word lines. In any case, redundant decoder XRED circuit and redundant subword line used for the defect replacement are used only within each bank and are not used for the defect replacement of another banks.

However, in the aforementioned semiconductor memory device,. for example when a defective memory cell physically existing in bank B is replaced with a redundant memory cell physically existing in bank A, two memory cells may be simultaneously activated in bank A if the redundant memory cell in bank A replacing the defective memory cell in bank B is to be activated at a timing which activates bank A. When these memory cells share a sense amplifier, a data line and so on, malfunction would occur. Since the addresses of two memory cells in different banks can be specified independently and optionally from the outside, this problem can not be avoided for all combinations of addresses.

Therefore, in the semiconductor memory device having a configuration such as shown in FIG. 1, it is impossible to remedy by sharing a redundant memory cell among different banks, so that a defective memory cell in each bank can be replaced only with the redundant memory cell in the same bank. Therefore, for a chip where defects locally exist in some banks, the whole chip can not be remedied at a time when a defective memory cell can not be replaced with a redundant memory cell even in one bank, which leads to a prime cause of reducing the yield.

Also, since cut of fuses with laser imposes a limitation on a finer fuse, a redundant decoder generally requires a larger area as compared with other circuits. Thus, the maximum number of redundant memory cells that can be provided is determined by the number of the redundant decoders that can be provided.

A semiconductor memory device has different patterns for the address arrangement of defective bits in terms of the structure and method of fabricating. These defective patterns are classified into a defective pattern which can be remedied by the replacement of one row address, such as a single bit defect caused by an element such as a transistor making up a memory cell and a single line defect caused by disconnection of a wiring in a memory cell array, and a defective pattern which can be remedied by replacement of a plurality of row addresses, such as a row decoder circuit defect and an adjacent lines defect caused by shorts among wirings in a memory cell array.

Also, even in a case where replacement of a plurality of lines is required, the number of adjacent row addresses requiring replacement is indefinite since it depends on the amount of dust accumulated during the step, which leads to a primary cause of shorts among wirings. Therefore, since in the prior art replacement of a defect for a fixed number of the row addresses is performed by one redundant decoder, a plurality of redundant decoders are needed to perform the replacement when the number of adjacent defective row addresses exceeds a replacement unit. Conversely, if the number of adjacent defective row addresses is below the replacement unit, replacement is performed including indefective the row address, adjacent to defective row address, thereby reducing the efficiency of using redundant memory cell.

FIG. 9 shows a conventional semiconductor memory device to overcome this problem. In the conventional semiconductor memory device shown in FIG. 1, redundant memory cell selection circuit XRDN and redundant decoder XRED are provided dedicatedly for each of banks A, B, while, in the semiconductor memory device shown in FIG. 9, redundant memory cell selection circuit XRDN and redundant decoder XRED are provided in common for banks A, B.

Therefore, subarray selection circuit SXC, row decoder XDEC, and subword line selection circuit RAIS in FIG. 9 differ in configuration from subarray selection circuit SXC, row decoder XDEC, and subword line selection circuit RAIS in FIG. 1.

FIG. 10a and FIG. 10b show the operation of the conventional semiconductor memory device shown in FIG. 9. FIG. 10a is a timing chart when a redundant memory cell is selected, while FIG. 10b is a timing chart when the redundant memory cell is not selected. The operations of signals not explained particularly are the same as those of the conventional semiconductor memory device in FIG. 1.

Row address signal XADD in this conventional semiconductor memory device includes bank selection signal CBS for specifying a bank in addition to a row address.

FIG. 11 is a circuit diagram showing an example of redundant decoder XRED, which includes fuses FBSN, FBST for storing a bank to be replaced, as an addition to redundant decoder XRED in FIG. 3.

As shown in FIG. 11, row address signal buffer circuit XABF generates complementary signals X0N to X10N, X0T to X10T in response to row address signal XADD, and complementary signals CBST, CBSN in response to bank selection signal CBS.

In redundant decoder XRED shown in FIG. 11, node 100 and node 101 are rendered conductive except when the replacement address stored in fuses FnN, FnT and row address signal XADD match, and the selected bank selection signal CBS and the bank to be replaced stored in fuses FCBN, FCBT match.

FIG. 12 is a circuit diagram showing an example of redundant memory cell selection circuit XRDN in which one redundant memory cell selection circuit XRDN exists for four redundant decoder XRED circuits.

Redundant memory cell selection circuit XRDN, when one of four defective addresses match signals XREBL connected thereto goes to a high level, pulls down redundant replacement selection signal XRDNS set at a high level to a low level by a precharge circuit (not shown). Redundant replacement selection signal XRDNS signal is a signal for indicating that a redundant memory cell is selected.

Signals XRLEN0, XRLEN1 are usually set at a high level by a precharge circuit (not shown) and are selectively pulled down to a low level in accordance with fuses FL00 to FL13 when one of four defective addresses match signals XREBL connected to XRDN goes to a high level. Signals XRLEN0, XRLEN1 indicate the number of subword lines to be replaced. In this case, one subword line is replaced when signals XRLEN0 and XRLEN1 are both at a low level, two subword lines are replaced when the signals at a high level, a low level respectively, and four subword lines are replaced when the signals at a low level, a high level, respectively.

Also, redundant row decoder selection signals RXDS0 and RXDS1, set at a high level by a precharge circuit (not shown), are selectively pulled down in accordance with fuses FX00 to FX13. Redundant row decoder selection signals RXDS0 and RXDS1 are signals for selecting the redundant main word line to be activated and the subarray including the main word line.

Additionally, redundant subword line selection signal RRAIS1 and RRAIS2 signals, which are signals for selecting subword selection signal RAI and, are set at a high level by a precharge circuit (not shown), are selectively pulled down in accordance with fuses FR0, FR1.

All of the signals remains at a high level unless the match is obtained by a comparison in one of the redundant decoders XRED.

Redundant decoder XRED and redundant memory cell selection circuit XRDN are not fixed with respect to the bank to which each of them belongs and operates regardless of the selected bank. Therefore, respective signals of redundant precharge signal PXR, latch signal XLAT, XPRE, redundant row decoder selection signal RXDS, redundant replacement selection signal XRDNS, and redundant subword line selection signal RRAIS are also shared among the banks and these signals operate regardless of the bank to be activated.

FIG. 13 is a circuit diagram showing an example of subarray selection circuit SXC. When row address signal XADD does not match any of the defect replacement addresses stored in redundant decoders XRED, and redundant row decoder selection signals RXDS0 and RXDS1 remain at a high level, then subarray selection circuit SXC decodes row predecode address signal PXADD (X9, X10), as shown in FIG. 10b, latches the signal generated by the decoding in response to row decoder address latch signal XDLA, activates a sense amplifier array (not shown) included in the subarray specified by row predecode address signal PXADD, and activates subarray selection signal BSEL, based on the latched signal.

When row address signal XADD matches any of the replacement addresses stored in redundant decoders XRED and redundant row decoder selection signals RXDS0, RXDS1 go to a low level, each subarray selection circuit SXC decodes redundant replacement selection signal XRDNS, latches the signal generated by the decoding in response to row decoder address latch signal XDLA, and activates a sense amplifier array specified by redundant replacement selection signal XRDNS, based on the latched signal, as shown in FIG. 10a. At this time, when the subarray indicated by row predecode address signal PXADD and the subarray indicated by redundant replacement selection signal XRDNS do not match, the redundant main word line and the sense amplifier array in the subarray indicated by row predecode address signal PXADD are inhibited to be activated.

At any case, a sense amplifier array to be activated is included in the subarray containing the activated word line.

FIG. 14 is a circuit diagram showing an example of row decoder XDEC. Row decoder XDEC latches row predecode address signal PXADD (X3 to X8) and subarray selection signal BSEL in response to row decoder address latch signal XDLA to activate the main word line. However, when row address signal XADD matches any of the replacement addresses stored in redundant decoders XRED and redundant row decoder selection signal RXDS goes to a low level, the activation will not be performed shown in FIG. 10a. Also, when ACT signal goes to a low level, all of the main word lines MWL are made unselected by row decoder precharge signal XDPR signal as shown in FIG. 10a.

FIG. 15 is a circuit diagram showing an example of redundant row decoder RXDC. When row address signal XADD matches any of the replacement addresses stored in redundant decoders XRED and redundant row decoder selection signal RXDS goes to a low level, redundant row decoder RXDC activates redundant main word line RMWL in response to redundant replacement selection signal XRDNS signal as shown in FIG. 10a. When ACT signal goes to a low level, all of redundant main word lines RMWL are made unselected by row decoder precharge signal XDPR as shown in FIG. 10b.

FIG. 16 is a circuit diagram showing an example of row decoder XDEC circuit. In row decoder XDEC circuit, subword line selection circuit RAI selects subword line selection signal RAI in response to row address predecode signal PXADD, RRAIS and redundant row decoder selection signal. When row address signal XADD does not match any of the defect replacement addresses of redundant decoders XRED circuits and redundant row decoder selection signal RXDS is at a high level, row decoder XDEC circuit activates only one of subword line selection signals RAI0 to RAI7 in accordance with row address signal XADD (X0 to X2). On the other hand, when row address signal XADD match any of the defect replacement addresses of redundant decoders XRED and at least one of redundant row decoder selection signals RXDS0, RXDS1 is at a low level, row decoder XDEC circuit activates redundant subword selection signal RRAIS.

When both of signals XRLEN0 and XRLEM1 are at a low level (the case of replacing one), RRAIS0 signal instead of X0 of row address signal XADD, RRAIS1 signal instead of X1 of row address signal XADD, and RRAIS2 signal instead of X2 of row address signal XADD are used to select one of RAI0 to RAI7.

When signal XRLEN0 is at a high level and signal XRLEN1 is at a low level (the case of replacing two), RRAIS1 signal instead of X1 of row address signal XADD, RRIAS2 signal instead of X2 of row address signal XADD, and X0 of row address signal XADD are used to select one of RAI0 to RAI7.

When signal XRLEN0 is at a low level and XRLEN1 is at a high level (the case of replacing four), RRIAS2 signal instead of X2 of row address signal XADD and X0, X1 of row address signal XADD are used to select one of RAI0 to RAI7, which selected signal is latched in response to XDLA signal. When ACT signal goes to a low level, all of RAI signals are made unselected by XDPR signal.

Main word line MWL and subword line selection signal RAI are applied to a subword driver circuit (not shown) to select subword line SWL through AND logic of these signals. Subword line SEL is directly connected to the memory cells to activate them.

When ACT signal goes to a low level, all of main word lines MWL or redundant main word lines RMWL and subword line selection signal RAI are made unselected by row decoder precharge signal XDPR, thereby deactivating sub row line SWL as well.

In this conventional semiconductor memory device, each bank whose replacement address to be stored by each redundant decoder XRED is determined through cutting the fuse selected from among a plurality of fuses.

There are four redundant main word lines and 32 relevant subword lines per bank similarly to the prior art shown in FIG. 1. There are 32 redundant decoders XRED for two banks (the same number exists in the chip as that of the prior art in FIG. 1).

Therefore, when all of redundant decoders XRED are used for bank A and each replacement is limited to one address (corresponding to a defect such as a single bit defect, subword line disconnect and so on), up to 32 defects can be remedied within a bank. Thus, when defects are not uniformly distributed among the banks, the efficiency of defect remedy may be increased.

On the other hand, four subword lines having addresses only differing in X0, X1 can be replaced with redundant memory cells by only one redundant decoder XRED. Thus, when the main word line (corresponding to eight subword lines having the same addresses other than X0 to X2) is defective for example, two redundant decoders XRED are used for replacement of eight subword lines. In this case, eight redundant decoders XRED can be used to remedy four main word lines (32 subword lines) per bank. Since there are only four main word lines per bank, no more remedy can be made for bank A. However, in this case, for bank B, the remaining 24 redundant decoders XRED can be used to remedy up to 24 defect points. Thus, the efficiency of defect remedy is increased even when the defect at one point comprises a plurality of sequential defective addresses.

As discussed above, unlike the conventional semiconductor memory device shown in FIG. 1, in the conventional semiconductor memory device in FIG. 9, the redundant memory cells existing in respective banks can be effectively used since redundant decoder XRED can be used for the replacement of defective cells for either of banks A, B. Even when defects exist locally in some banks, the probability of remedy is increased as compared with the prior art shown in FIG. 1 in spite of the same number of redundant decoders XRED and the same number of the redundant memory cells, so that yields can be enhanced without substantially increasing the chip area.

For a synchronous DRAM, in reading/writing, only the bank to which the memory intended for the reading/writing belongs is activated, while a plurality of banks are simultaneously activated in refreshing. In reading/writing, the relevant word line is activated and then a sense amplifier is operated, while only a sense amplifier is operated in refreshing.

Although in the above-mentioned conventional semiconductor memory device, redundant decoder XRED is shared among banks A, B to thereby increase the replacement efficiency, a problem occurs in refreshing when both banks A, B are simultaneously activated. For example, when replacement of a defective memory cell in bank A is performed, redundant replacement selection signal XRDNS is supplied also to bank B if both banks A, B are to be simultaneously activated, which forces the replacement to be performed in bank B even with no need for it.

In this manner, in the conventional semiconductor memory device in FIG. 9, both banks can not be simultaneously activated for refreshing when respective defects exist in different banks. Also, if both banks are simultaneously activated for refreshing, the redundant decoder must be provided for each bank.

That is, the above-mentioned conventional semiconductor memory device shown in FIG. 9 has a drawback in that a redundant decoder is required for each bank and to the replacement efficiency is reduced, thus deteriorating yields, because a plurality of different banks can not be simultaneously activated for refreshing when the redundant decoder is provided in common for a plurality of banks and respective defects exist in different banks.

SUMMARY OF THE INVENTION

It is an object of the present invention to provide a semiconductor memory device capable of refreshing even when respective defects may exist in different banks, in order to increase the replacement efficiency, thereby improving a yield.

The present invention is applied to a semiconductor memory device having a memory cell block including a plurality of memory cells, a plurality of redundant memory cells for replacing defective memory cells in the memory cell block, a plurality of banks capable of reading/writing independently of each other, a plurality of redundant decoders, and replacement memory cell storage means.

The redundant decoder is shared among the plurality of banks, stores the address of the defective memory cell, and compares an address indicated by an applied address signal with the address of the defective memory cell stored therein. The replacement memory cell storage means stores the address of a redundant memory cell for the replacement of the defect memory cell, and activates the redundant memory cell for replacing the defective memory cell when the address indicated by the address signal and the address of the defective memory cell matches the address stored in each of the redundant decoders.

In order to achieve the above-mentioned object, in the semiconductor memory device according to the present invention, the redundant decoder, in addition to the operation described above, compares the address indicated by an address signal with the stored address of a defective memory cell without referring to a bank selection signal included in the address signal in refreshing operation. The replacement memory cell storage means, in addition to the operation described above, outputs for each of the banks a redundant replacement selection signal indicative of a bank in which replacement is performed with a redundant memory cell.

In the refreshing operation, each of the redundant decoders compares the address indicated by the address signal with a address of the defective memory cell without referring to the bank selection signal included in the address signal. The replacement memory cell storage means outputs for each of the banks the redundant replacement selection signal indicative of a bank in which replacement is performed with a redundant memory cell.

Therefore, a determination is made as to whether replacement is performed or not for each bank even in the refreshing when a plurality of banks are simultaneously activated, so that the replacement of memory cells which belong to the plurality of banks and simultaneously activated can be performed by the common redundant decoder. As a result, yields can be improved due to an increased replacement efficiency.

The above and other objects, features and advantages of the present invention will become apparent from the following description with reference to the accompanying drawings which illustrate examples of the present invention.

DETAILED DESCRIPTION OF THE PREFERRED EMBODIMENT

Figure 1:
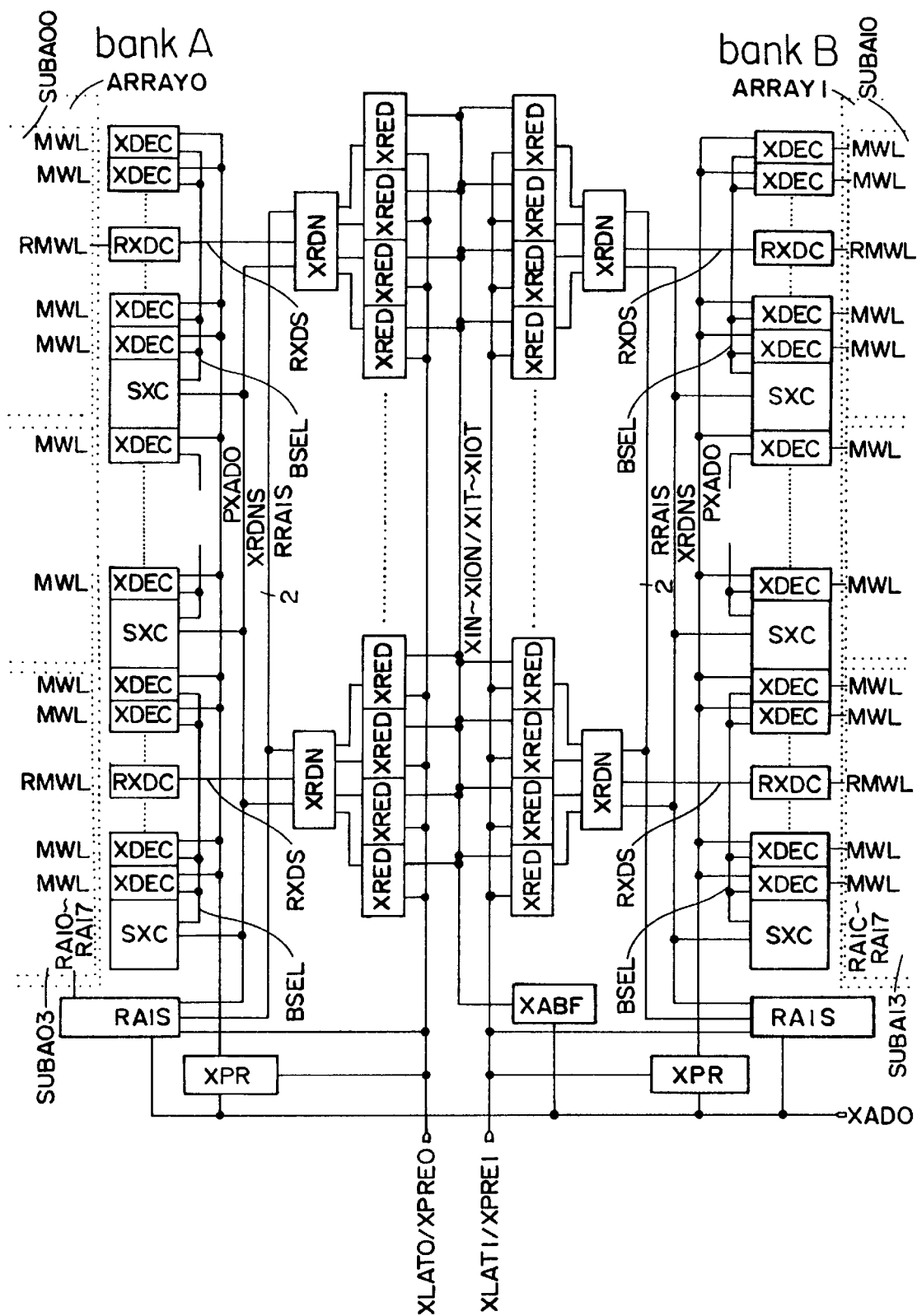
FIG. 1 is a block diagram showing a configuration of a conventional semiconductor memory device.
Figure 2A:
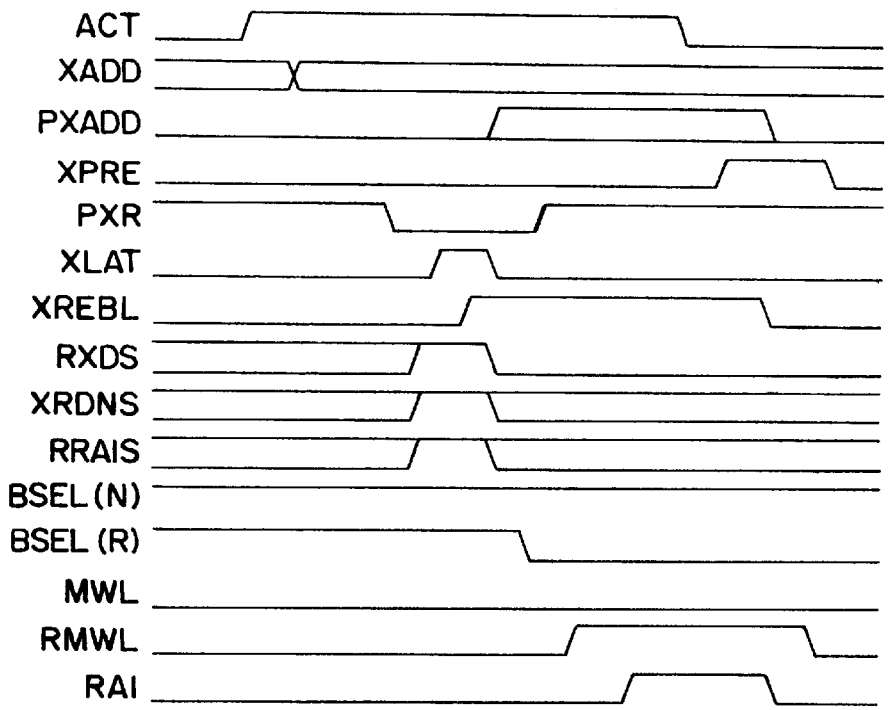
FIG. 2a is a timing chart showing the operation when a defective address is selected in the prior art.
Figure 2B:
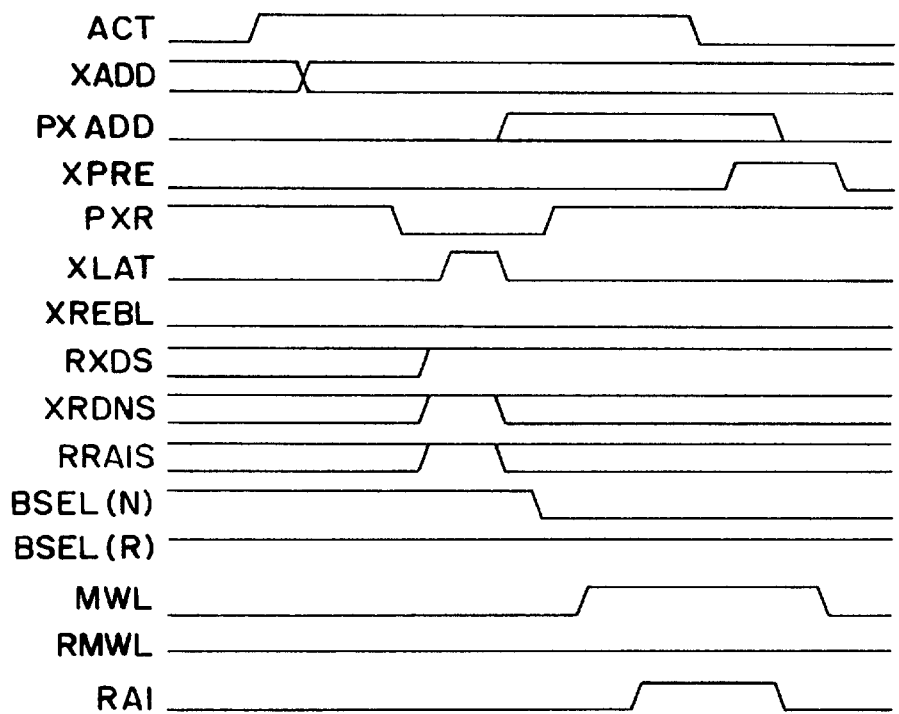
FIG. 2b is a timing chart showing the operation when a defective address is not selected.
Figure 3:
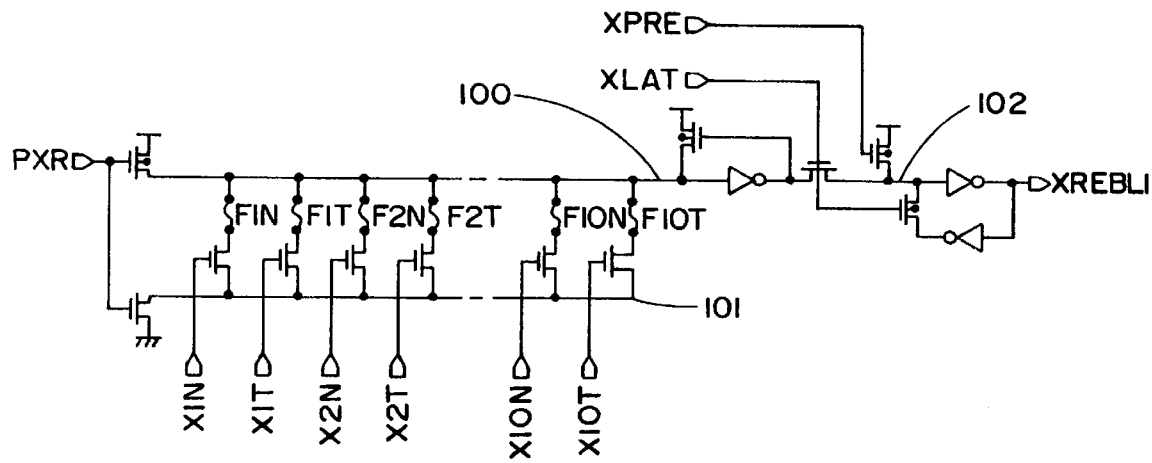
FIG. 3 is a circuit diagram showing an example of redundant decoder XRED in FIG. 1.
Figure 4:
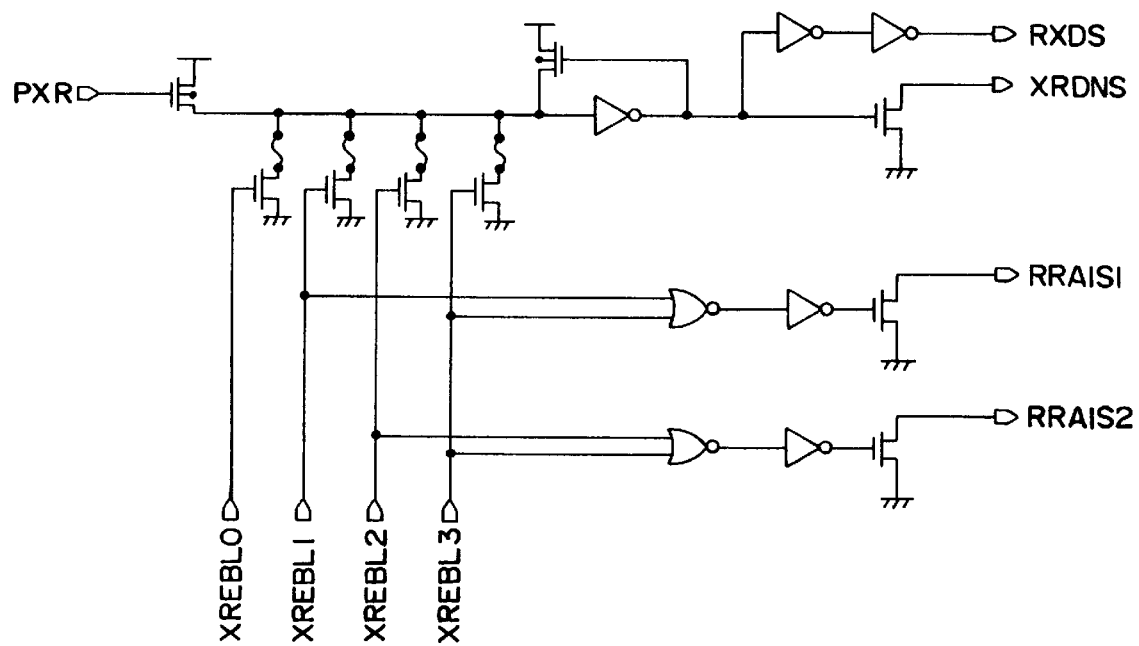
FIG. 4 is a circuit diagram showing an example of redundant memory cell selection circuit XRDN in FIG. 1.
Figure 5:
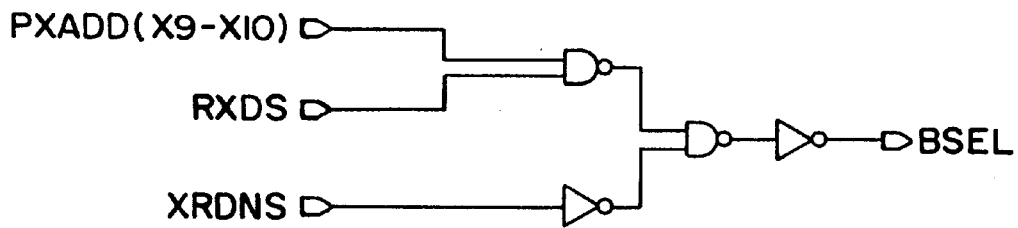
FIG. 5 is a circuit diagram showing an example of SXC circuit in FIG. 1.
Figure 6:
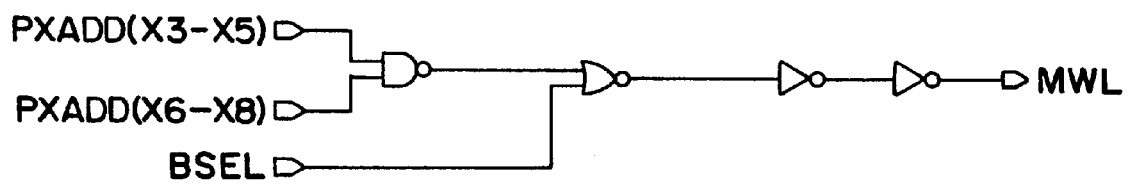
FIG. 6 is a circuit diagram showing an example of row decoder XDEC in FIG. 1.
Figure 7:
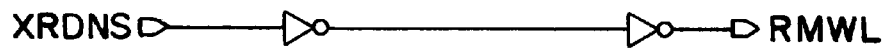
FIG. 7 is a circuit diagram showing an example of redundant row decoder RXDC in FIG. 1.
Figure 8:
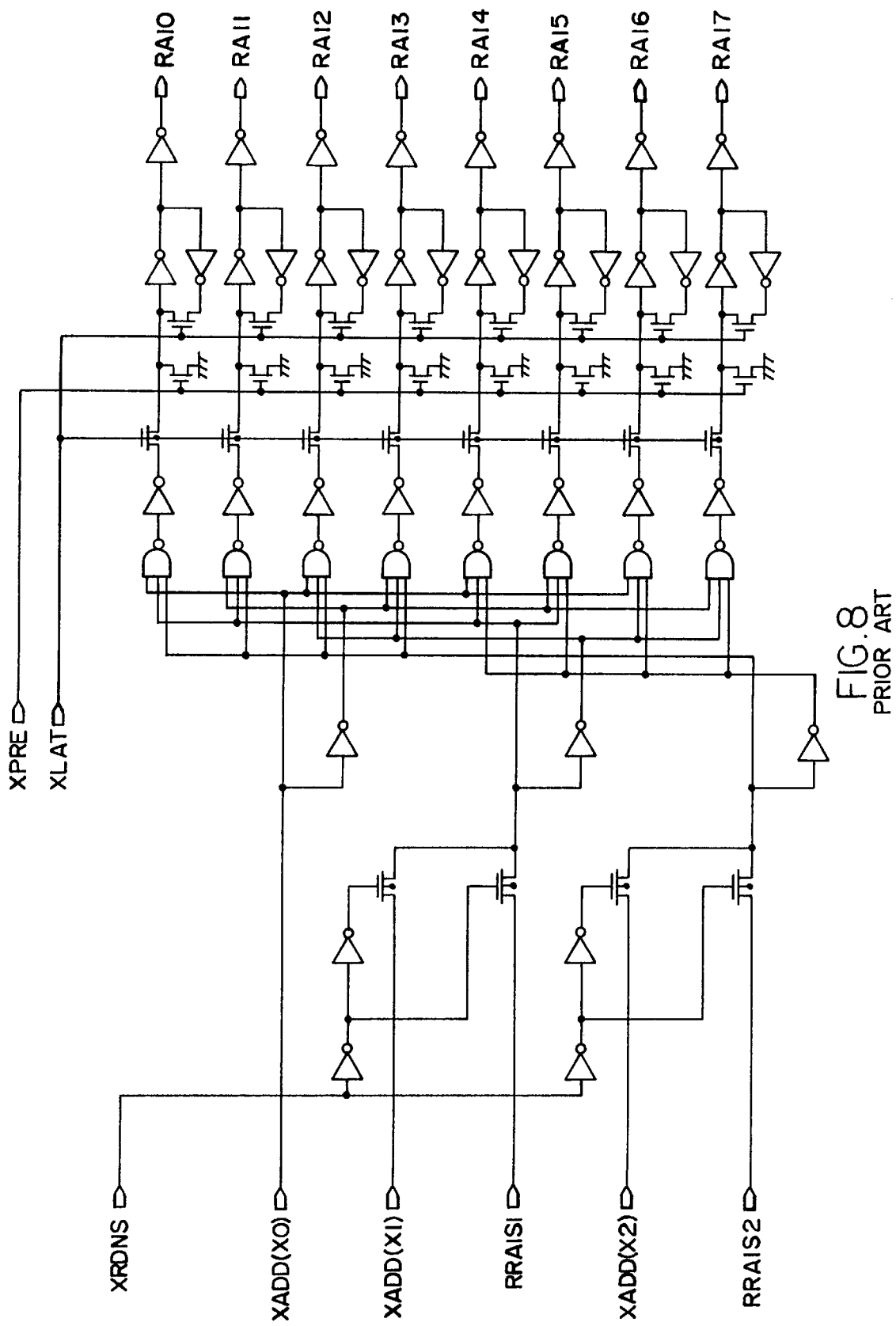
FIG. 8 is a circuit diagram showing an example of subword line selection circuit RAIS in FIG. 1.
Figure 9:
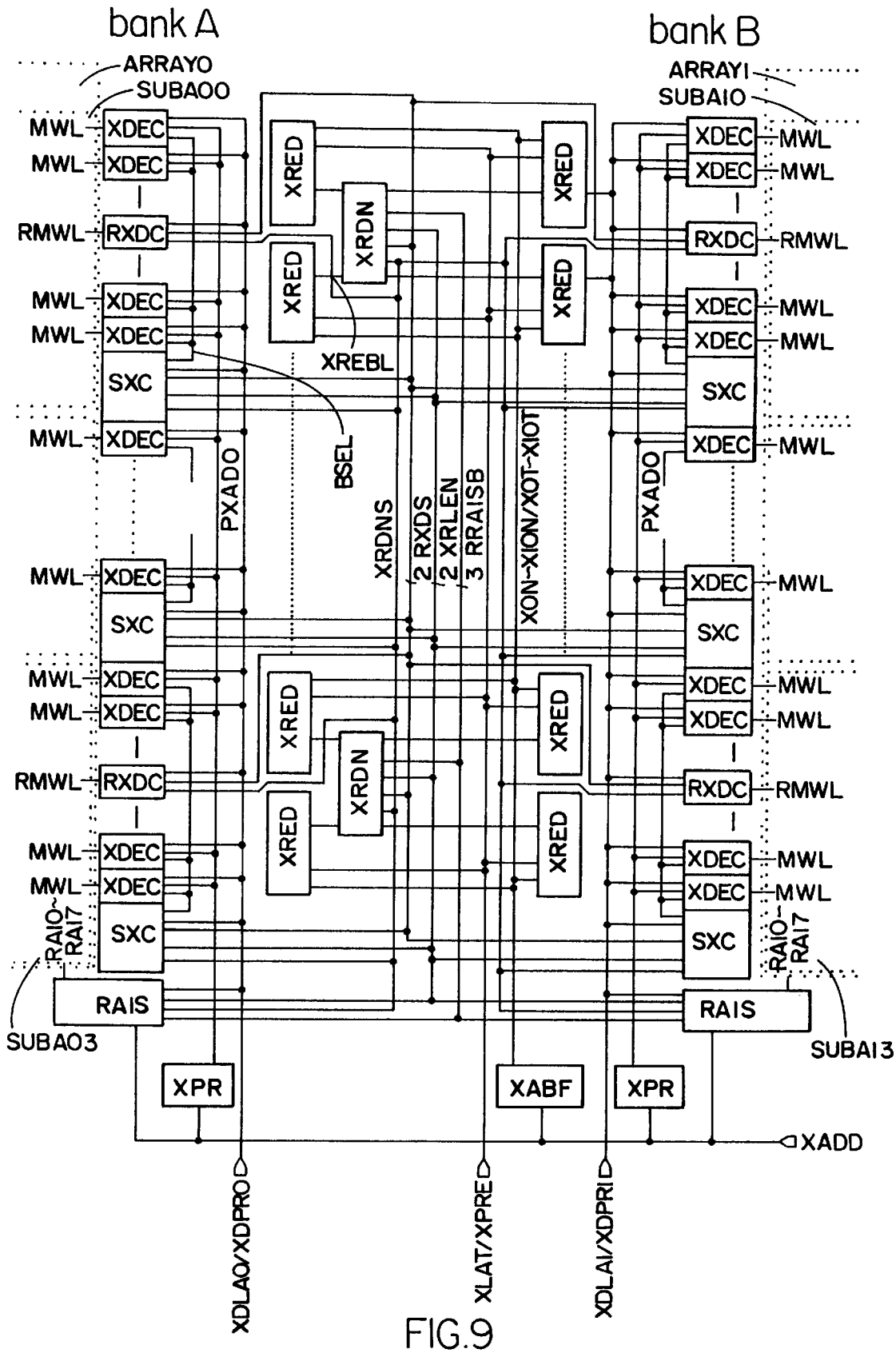
FIG. 9 is a block diagram showing a configuration of another conventional semiconductor memory device.
Figure 17:
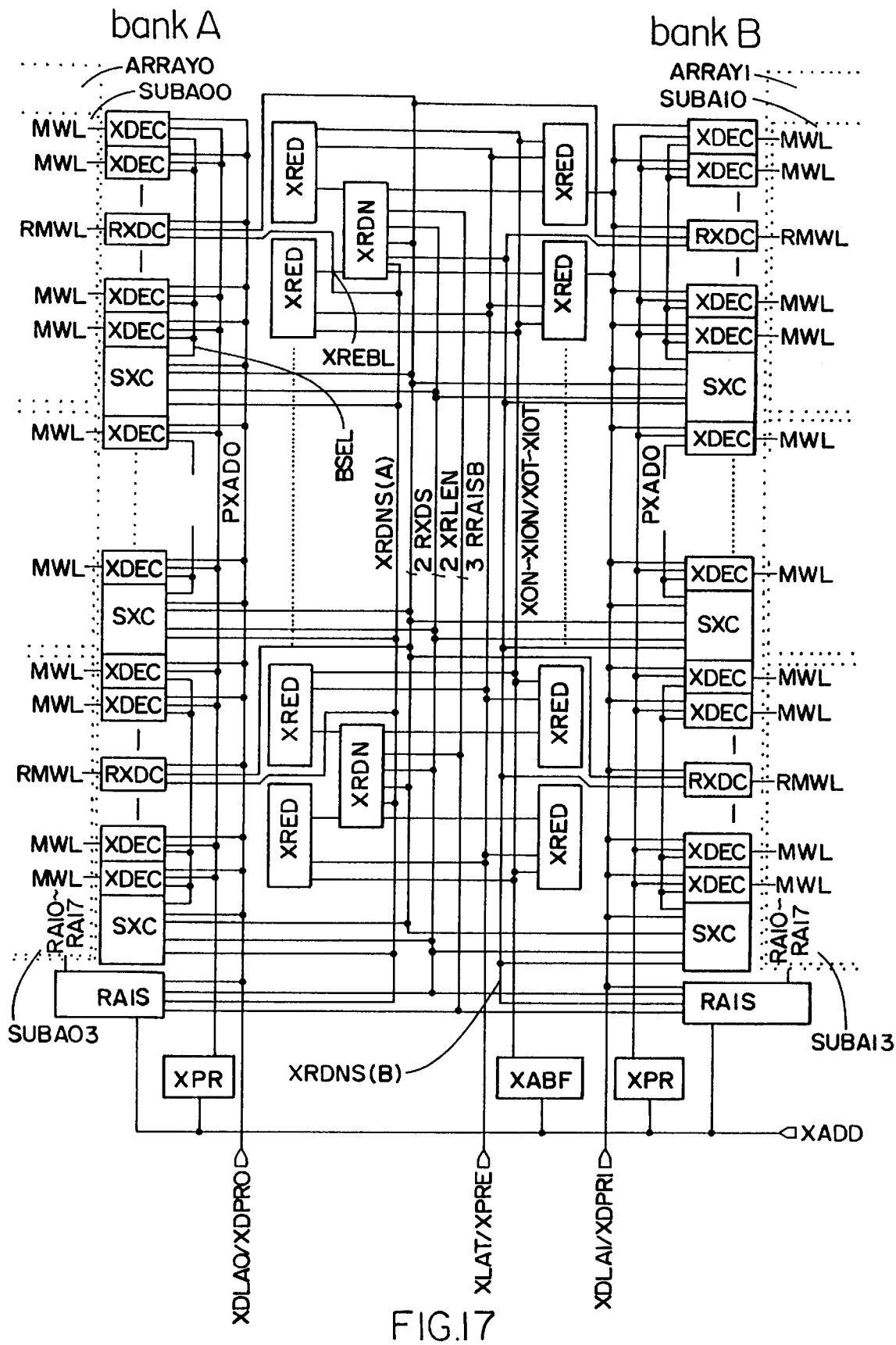
FIG. 17 is a block diagram showing a configuration of a semiconductor memory device according to one embodiment of the present invention.

Redundant memory cell selection circuit XRDN in the conventional semiconductor memory device in FIG. 9 outputs only redundant replacement selection signal XRDNS indicating that the redundant memory cell has been selected when the replacement is performed by the redundant memory cell. Whereas, redundant memory cell selection circuit XRDN in a semiconductor memory device according to one embodiment of the present invention, as shown in FIG. 17, is designed to output redundant replacement selection signal XRDNS(A) indicating that the redundant memory cell in bank A has been selected, and redundant replacement selection signal XRDNS(B) indicating that the redundant memory cell in bank B has been selected. Redundant replacement selection signal XRDNS(A) is applied to redundant row decoder RXDC, subarray selection circuit SXC, and subword line selection circuit RAIS, all of which are provided in bank A, while redundant replacement selection signal XRDNS(B) is applied to redundant row decoder RXDC, subarray selection circuit SXC, and subword line selection circuit RAIS, all of which are provided in bank B.

Figure 18:
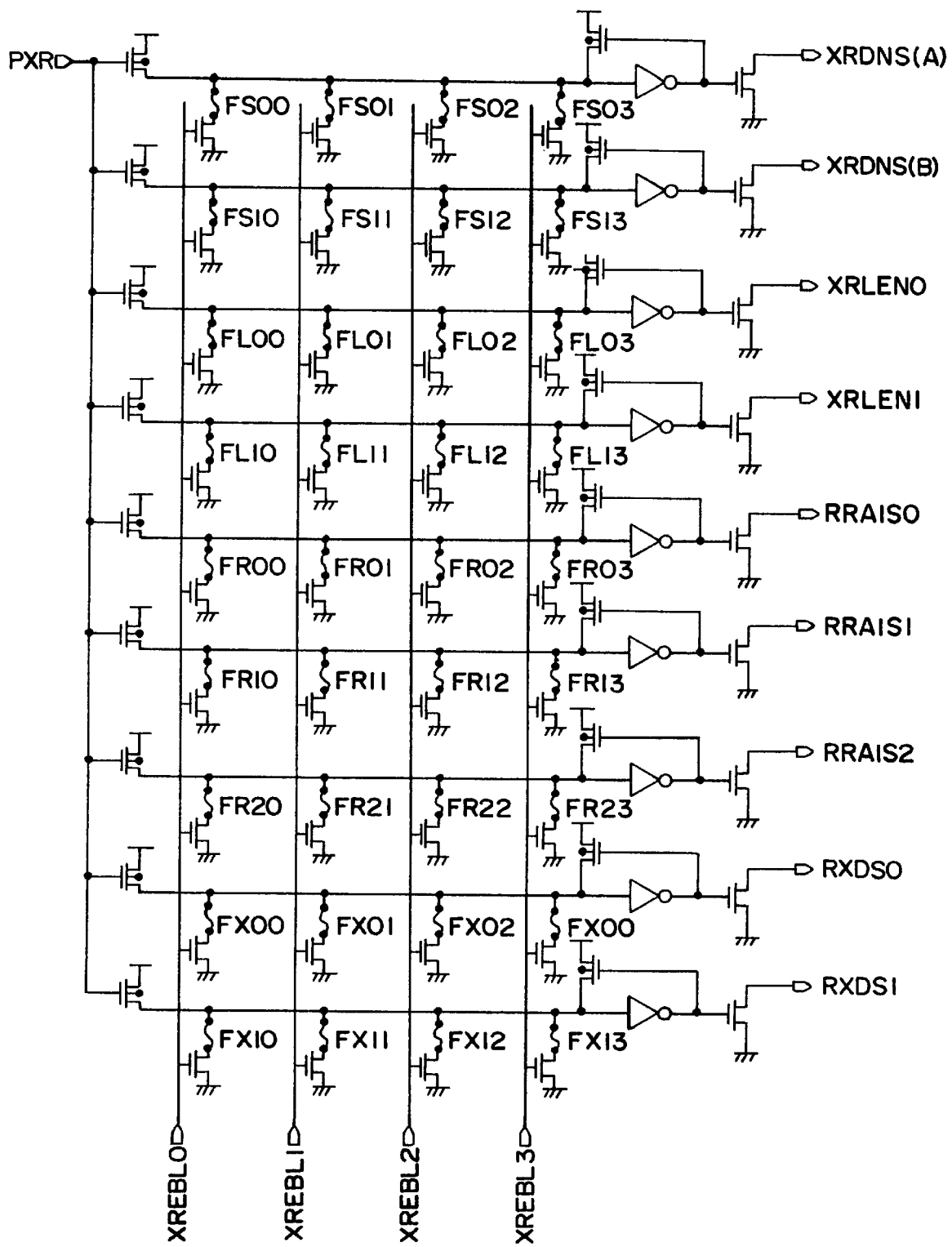
FIG. 18 is a circuit diagram of redundant memory cell selection circuit XRDN in FIG. 17.

With reference to FIG. 18, in the redundant memory cell selection circuit XRDN, when defective address match signals XREBL0 to 3 go to a high level, redundant replacement selection signal XRDNS(A) goes to a low level if the corresponding fuses within fuses FS00 to FS03 are not cut. Also, when defective address match signals XREBL0 to 3 similarly go to a high level, redundant replacement selection signal XRDNS(B) goes to a low level if the corresponding fuses within fuses FS10 to FS13 are not cut.

Row address signal buffer XABF in the semiconductor memory device of the present embodiment is designed to determine that the device is in refreshing, set both complementary signals CBST, CBSN to a low level, and outputs these signals when bank selection signal CBS of upper bits in row address signal XADD is not applied.

Thus, in refreshing, defective address match signal XREBL is outputted only if the row address matches the address stored in the redundant decoder XRED, regardless of which bank A or B redundant decoder XRED is assigned to. In redundant memory cell selection circuit XRDN, fuses are set such that redundant replacement selection signal XRDNS is supplied to the same bank as the bank to which redundant decoder XRED having outputted defective address match signal XREBL applied to redundant memory cell selection circuit XRDN is assigned.

For example, when defective address match signal XREBL outputted from redundant decoder XRED for bank A is applied to a redundant memory cell selection circuit XRDN, only redundant replacement selection signal XRDNS(A) is outputted and redundant replacement selection signal XRDNS(B) is not outputted. Thus, the replacement is performed in bank A by the redundant memory cell, while the replacement is not performed in bank B.

In this way, in the semiconductor memory device of the present invention, only the bank to be replaced can be actually replaced even in refreshing where no bank selection signal CSA in row address signal XADD is present.

Figure 10A:
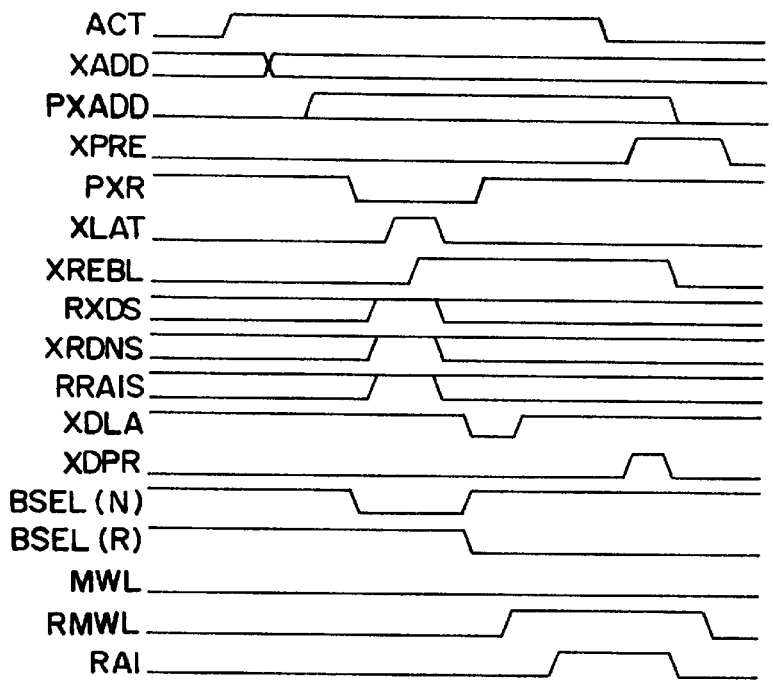
FIG. 10a is a timing chart showing the operation when a defective address is selected in the semiconductor memory device in FIG. 9.
Figure 10B:
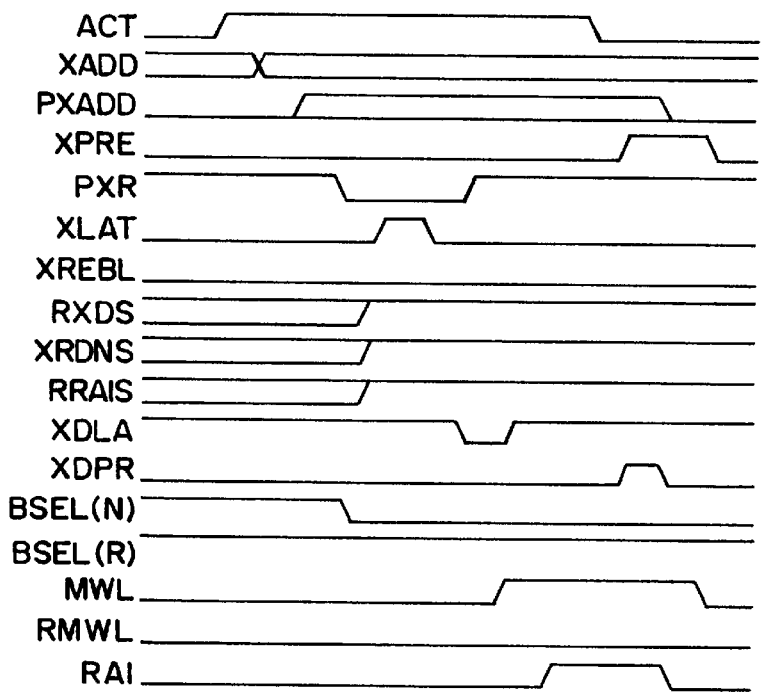
FIG. 10b is a timing chart showing the operation when a defective address is not selected in the semiconductor memory device in FIG. 9.
Figure 11:
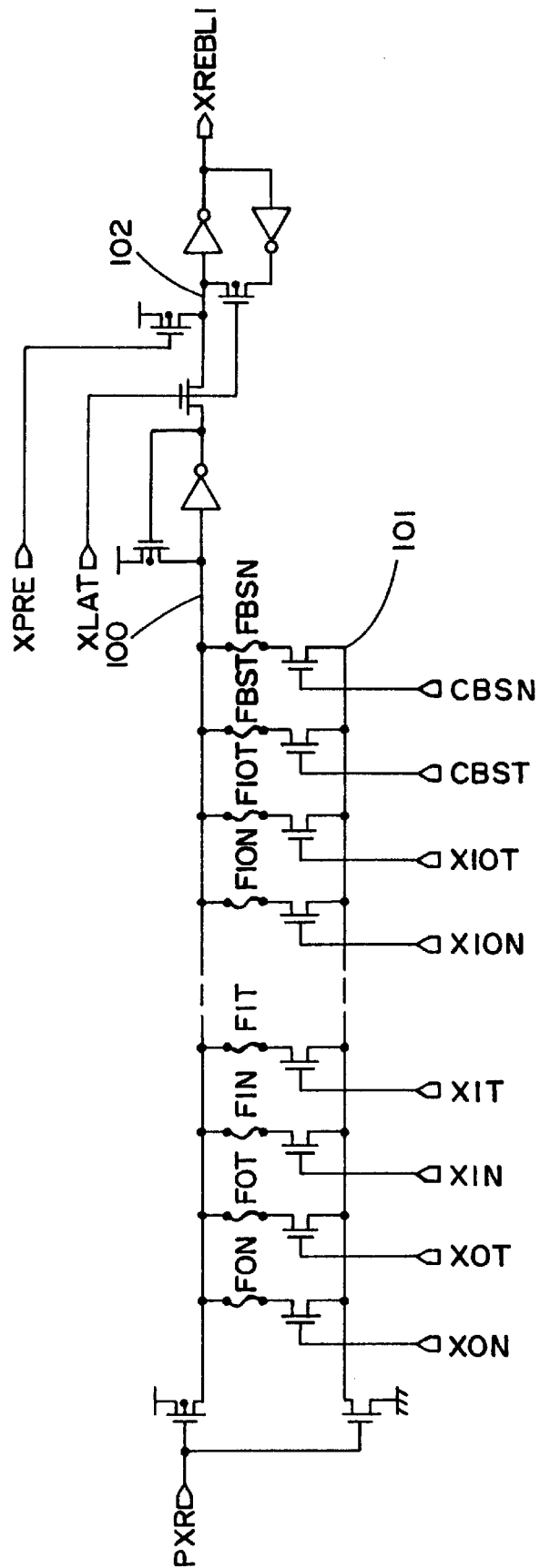
FIG. 11 is a circuit diagram showing an example of redundant decoder XRED in FIG. 9.
Figure 12:
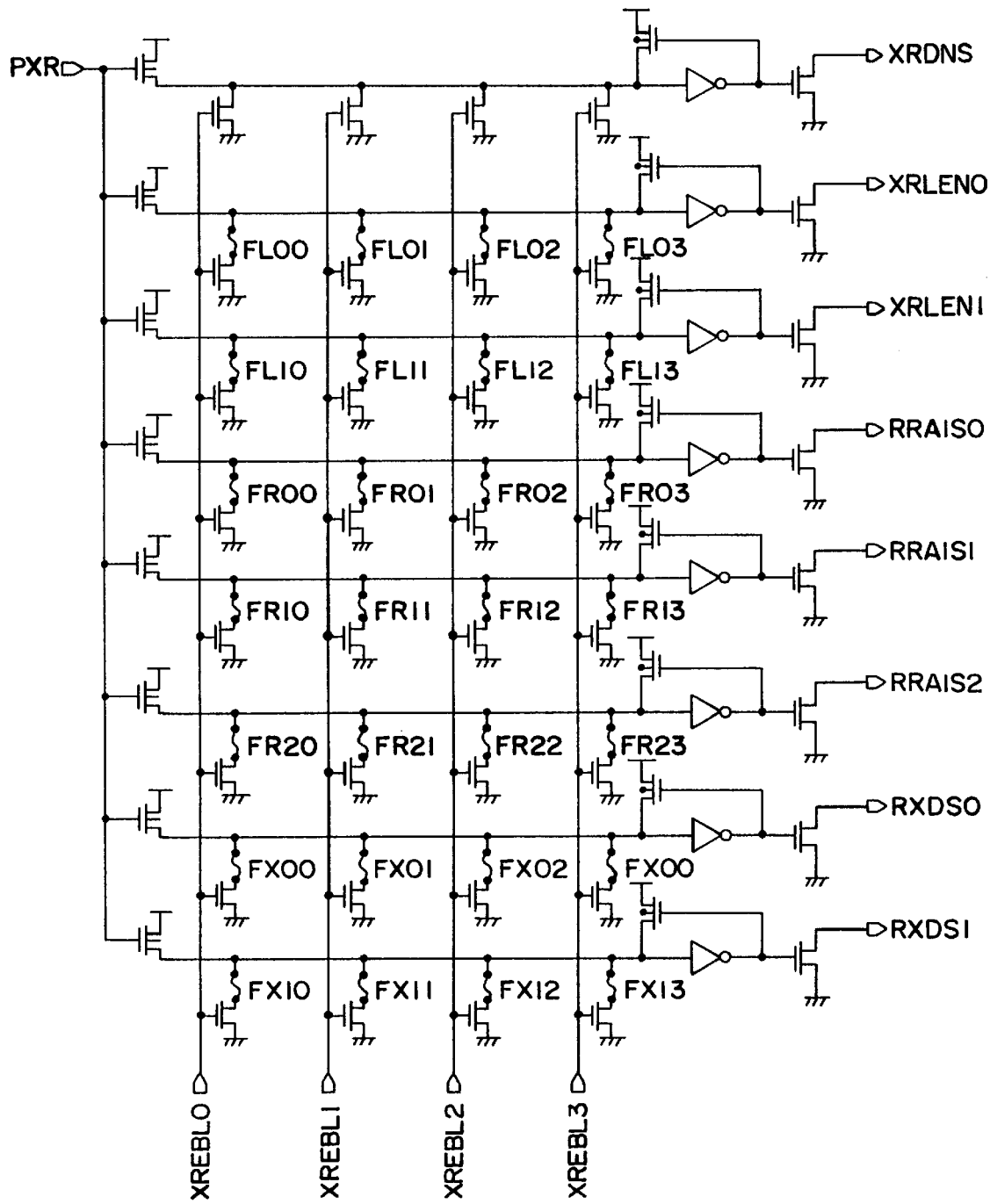
FIG. 12 is a circuit diagram showing an example of redundant memory cell selection circuit XRDN in FIG. 9.
Figure 13:
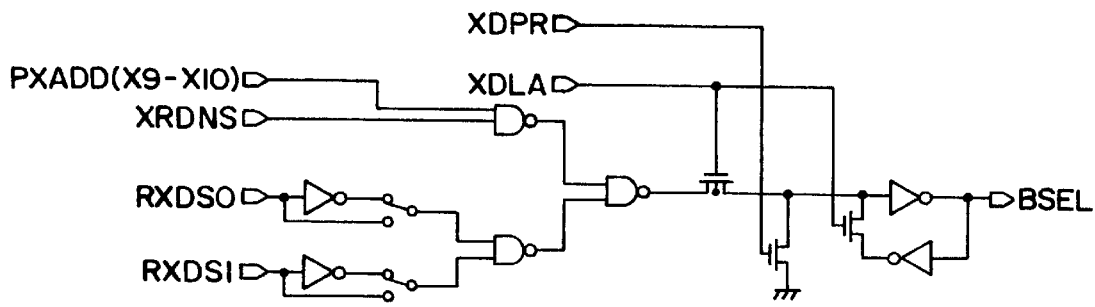
FIG. 13 is a circuit diagram showing an example of subarray selection circuit SXC in FIG. 9.
Figure 14:
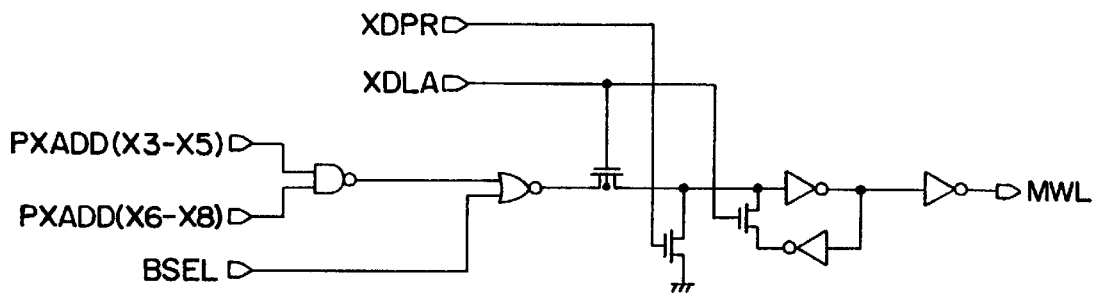
FIG. 14 is a circuit diagram showing an example of row decoder XDEC in FIG. 9.
Figure 15:
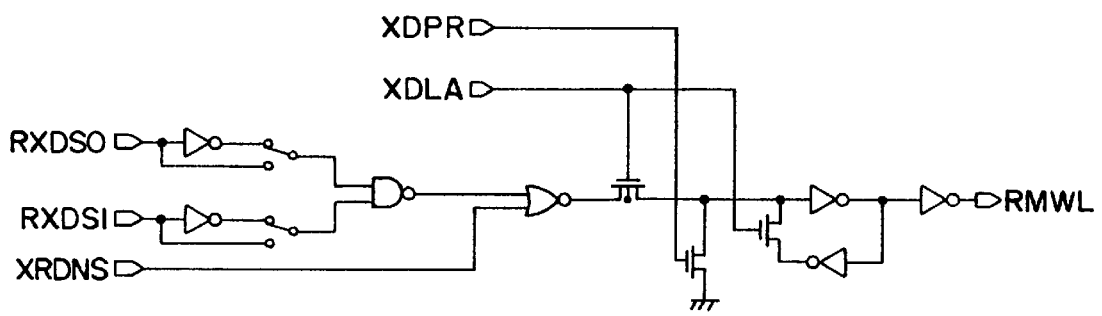
FIG. 15 is a circuit diagram showing an example of redundant row decoder RXDC in FIG. 9.
Figure 16:
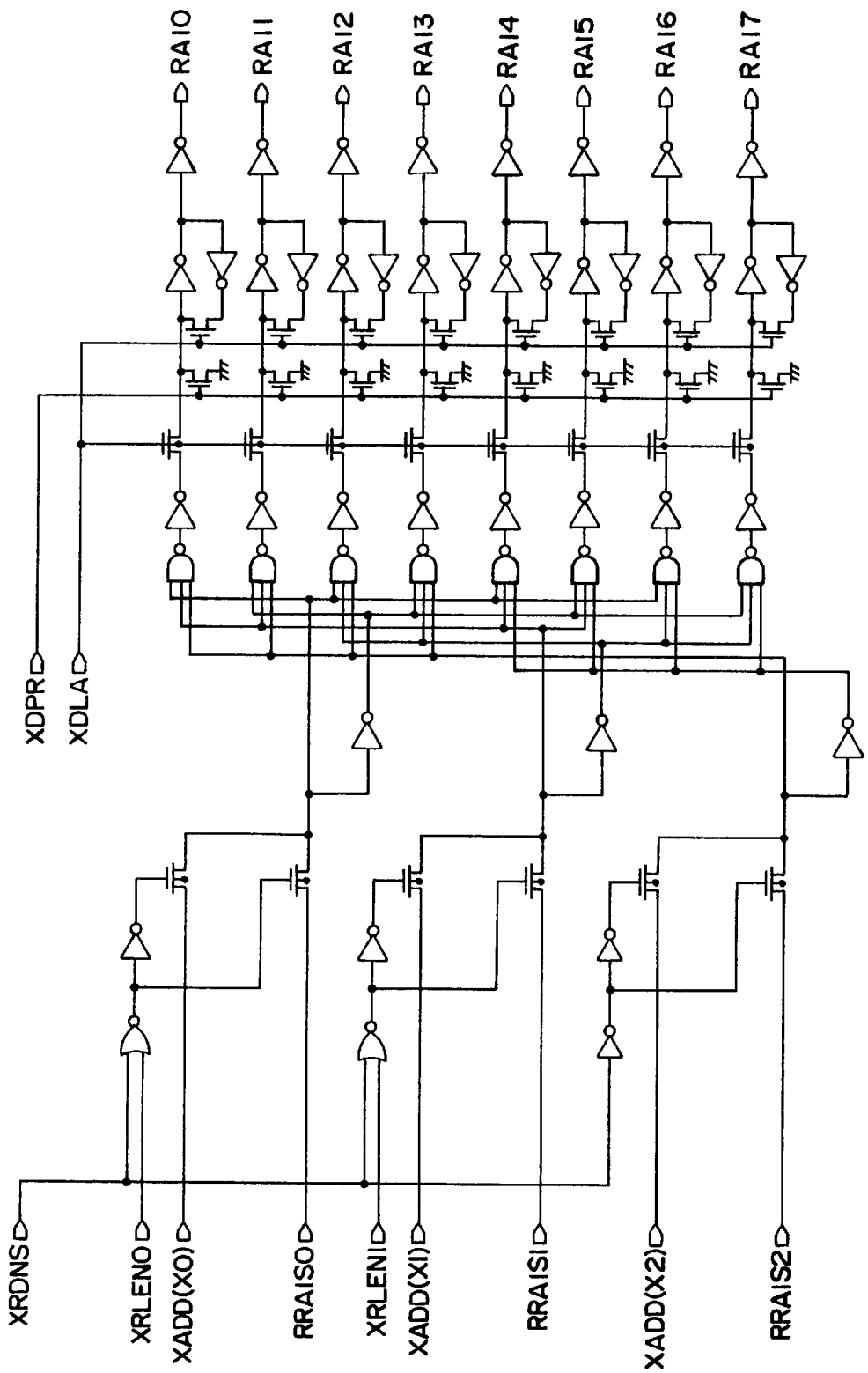
FIG. 16 is a circuit diagram showing an example of subword line selection circuit RAIS in FIG. 9.

FIG. 19 to FIG. 22 are timing charts showing the operation of the present embodiment. The operations of the signals other than redundant replacement selection signals XRDNA(A), XRDNS(B) in these timing charts are similar to those in FIG. 10a, FIG. 10b, and the description thereof is omitted.

Figure 19:
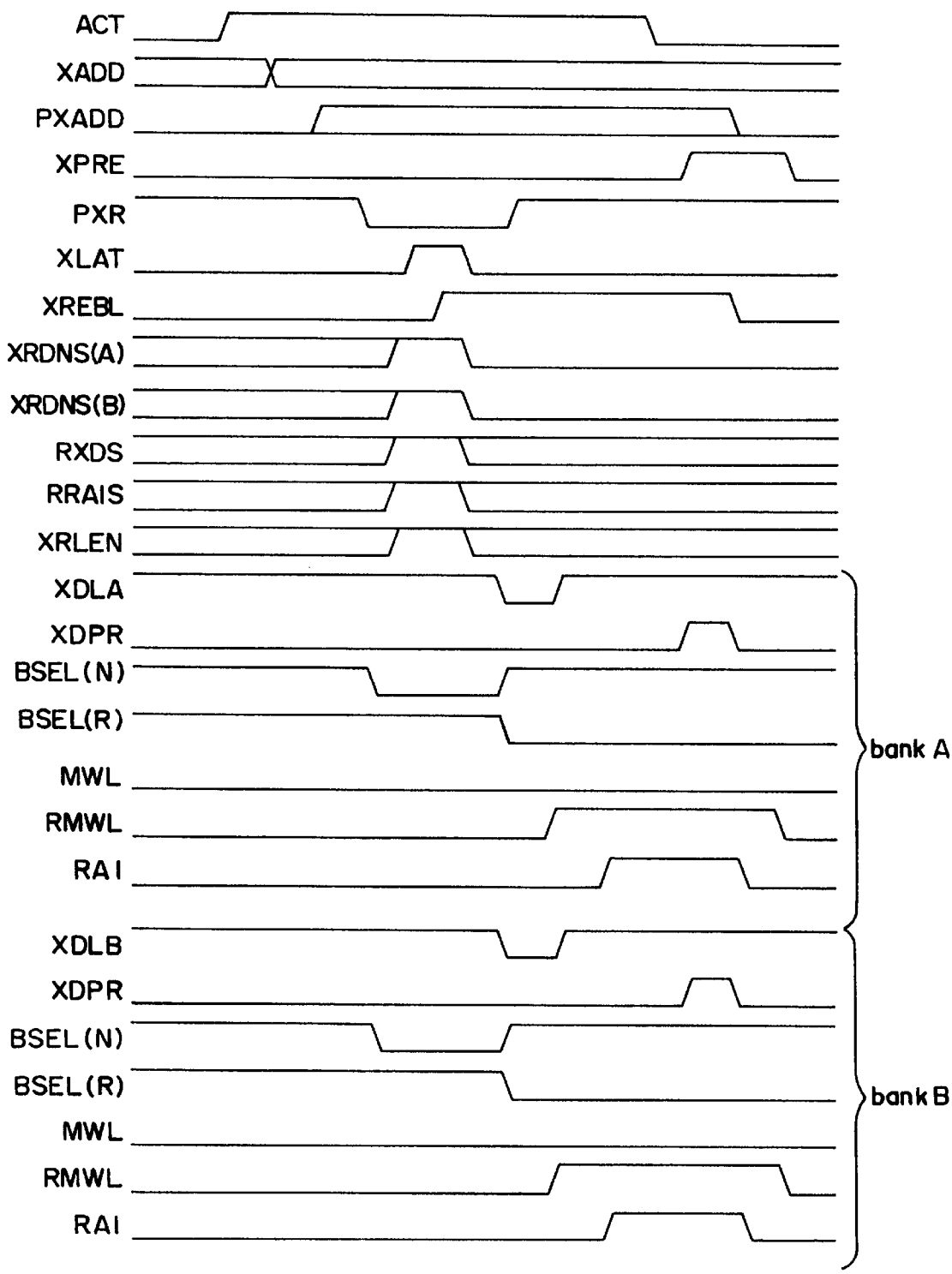
FIG. 19 is a timing chart showing the operation in refreshing when the replacement is performed in both banks A, B.

FIG. 19 is a timing chart showing the operation in refreshing when the replacement is performed in both banks A, B.

In this case, both redundant replacement selection signals XRDNS(A), XRDNS(B), after once precharged and going to a high level, goes to a low level, i.e. active through defective address match signal XREBL. Thus, redundant main word lines RMWL are activated instead of main word lines MWL in both banks A, B.

Figure 20:
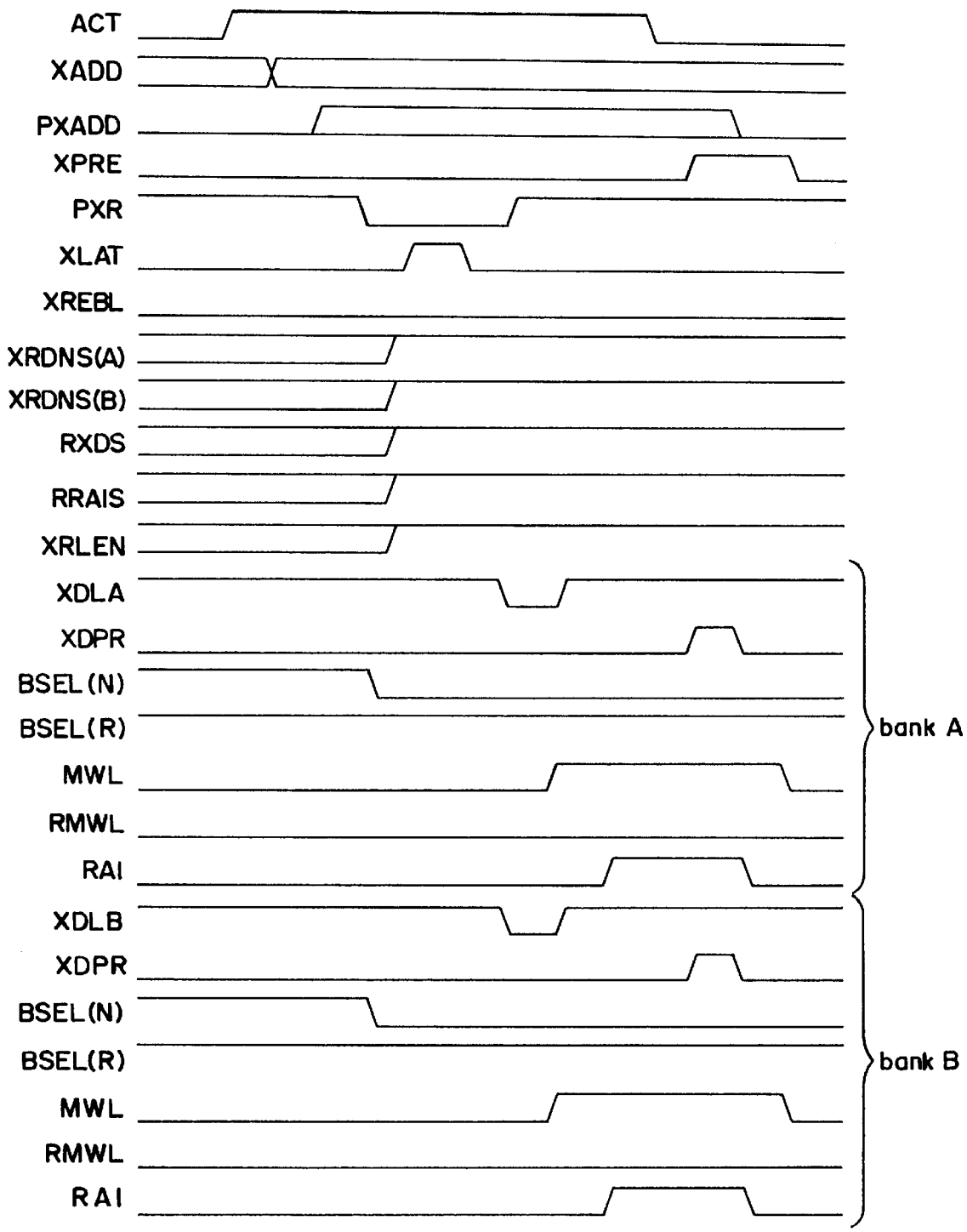
FIG. 20 is a timing chart showing the operation in refreshing when the replacement is not performed in either of banks A, B.

FIG. 20 is a timing chart showing the operation in refreshing when the replacement is not performed in either bank A or B.

In this case, both redundant replacement selection signals XRDNS(A), XRDNS(B), after once precharged and going to a high level, remain at the high level, i.e. inactive. Therefore, main word lines MWL are activated and redundant main word lines RMWL are not activated in either bank A or B.

Figure 21:
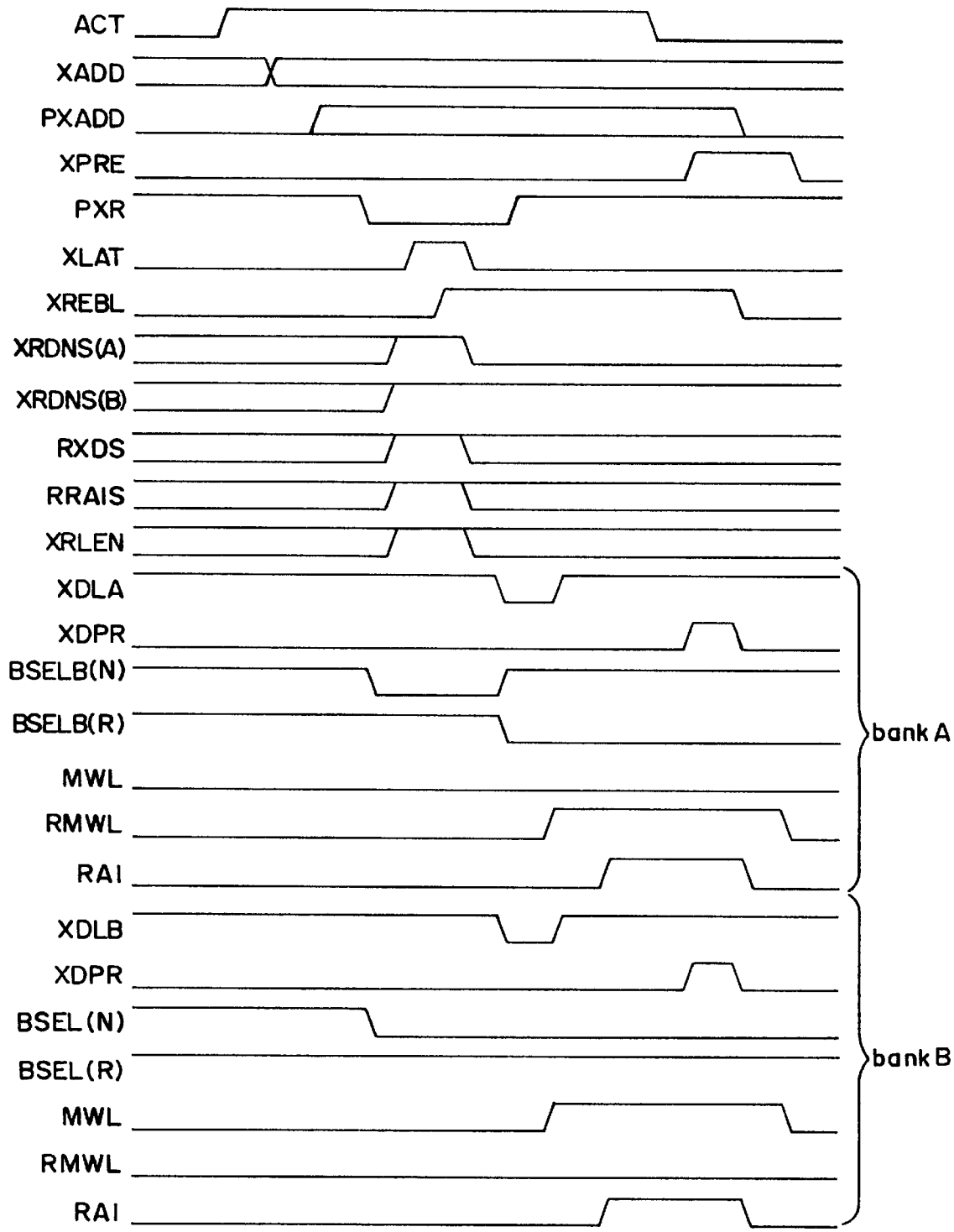
FIG. 21 is a timing chart showing the operation in refreshing when the replacement is performed only in bank A.

FIG. 21 is a timing chart showing the operation in refreshing when the replacement is performed only in bank A.

In this case, redundant replacement selection signal XRDNS(A), after once precharged and going to a high level, goes to a low level, i.e. active by defective address match signal XREBL. However, redundant replacement selection signal XRDNS(B), after once precharged and going to a high level, remains at the high level, i.e. inactive. Therefore, redundant main word RMWL is activated in bank A, while main word line MEL is activated in bank B.

Figure 22:
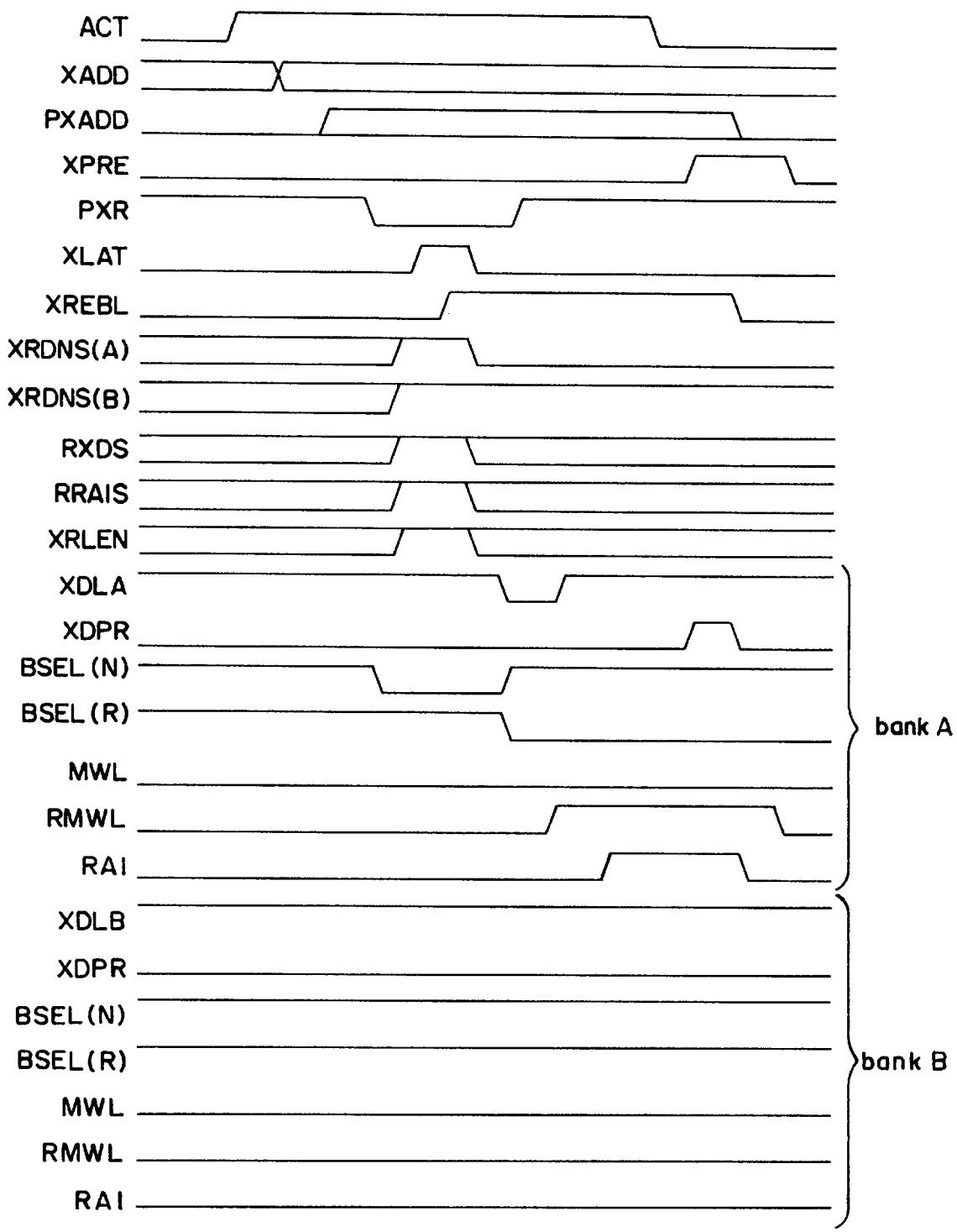
FIG. 22 is a timing chart showing the operation in reading/writing when the replacement is performed only in bank A.

FIG. 22 is a timing chart showing the operation in reading/writing when the replacement is performed only in bank A.

In this case, redundant replacement selection signal XRDNS(A), after once precharged and going to a high level, goes to a low level, i.e. active by defective address match signal XREBL. However, redundant replacement selection signal XRDNS(B), once precharged and going to a high level, remain at the high level, i.e. inactive. Therefore, redundant main word line RMWL is activated in bank A. However, in this case, bank B itself is not activated, so that all the signals for bank B are in an inactive state.

In the semiconductor memory device according to the present invention, even when both banks are simultaneously activated for performing refreshing, redundant replacement selection signals XRDNS(A), (B) are respectively provided for respective banks to allow the selection of the bank to be replaced, thereby avoiding a problem that the memory cell requiring no replacement is replaced. Accordingly, even in reading/writing and in refreshing, memory cells which belong to different banks and are to be simultaneously activated can be replaced by the redundant decoder in common among the banks. Thus, the replacement efficiency in the redundant memory cell is increased and the yield for the semiconductor memory device can be improved.

It should be noted that, although the present embodiment has given an example of the replacement of defective memory cells with the redundant memory cells in accordance with row addresses, the semiconductor memory device can be modified so as to meet the spirit of the present invention similarly for the replacement of defective memory cells with the redundant memory cells in accordance with column addresses.

Additionally, although in the present invention, redundant decoder XRED stores addresses of defective memory cells to be replaced, in accordance with the presence or absence of the cut of fuses, the present invention is not limited to this. The present invention can be applied any memory means as long as it is a nonvolatile memory means capable of storing addresses even when the power supply is turned off.

While a preferred embodiment of the present invention has been described using specific terms, such description is for illustrative purposes only, and it is to be understood that changes and variations may be made without departing from the spirit or scope of the following claims.

What is claimed is:

1. A semiconductor memory device comprising:
a. a plurality of banks including a memory cell block having a plurality of memory cells and a plurality of redundant memory cells to replace defective memory cells in the memory cell block, said plurality of banks being capable of performing reading/writing independently of each other;
b. a plurality of redundant decoders shared among said plurality of banks, for storing an address of the defective memory cell and the bank to which the defective memory cell belongs, for comparing an address and a bank selection signal indicated by an applied address signal with the address of the defective memory cell and the bank to which the defective memory cell belongs, respectively, in a data reading/writing operation, and for comparing only the address indicated by the address signal with the address of the defective memory cell in a refreshing operation;
c. replacement memory cell storage means for storing addresses of the redundant memory cells to replace the defective memory cells, for activating the redundant memory cells to replace the defective memory cells, and for outputting to each of said banks a redundant replacement selection signal for indicating the bank in which replacement is to be performed with the redundant memory cell when the address indicated by the address signal matches the address of the defective memory cell stored in each of said redundant decoders.

2. The semiconductor memory device according to claim 1, further comprising redundant row activation means for activating and deactivating a redundant word line based on an indication from said replacement memory cell storage means.

3. The semiconductor memory device according to claim 1,
wherein each of said redundant decoders includes means for storing the addresses of the defective memory cells in an array of the memory cell in accordance with the presence or absence of the cut of a plurality of fuses, and
wherein said replacement memory cell storage means includes means for storing the addresses of the redundant memory cells to replace the defective memory cells, in accordance with the presence or absence of the cut of a plurality of fuses.

4. The semiconductor memory device according to claim 1, wherein each memory cell and each redundant memory cell are connected to a subword line, a plurality of the subword lines being associated with one main word line.

5. The semiconductor memory device according to claim 1, wherein each redundant decoder includes means for comparing the address indicated by the address signal and the stored address of the defective memory in the number of bits differing between the data read/write operation for the memory cell and the refreshing operation, thereby making no reference to the bank selection signal.

6. The semiconductor memory device according to claim 5, further comprising redundant row activation means for activating and deactivating a redundant word line based on an indication from said replacement memory cell storage means.

7. The semiconductor memory device according to claim 5,
wherein each of said redundant decoders includes means for storing the addresses of the defective memory cells in an array of the memory cell in accordance with the presence or absence of the cut of a plurality of fuses, and wherein said replacement memory cell storage means includes means for storing the addresses of the redundant memory cells to replace the defective memory cells, in accordance with the presence or absence of the cut of a plurality of fuses.

8. The semiconductor memory device according to claim 5, wherein each memory cell and each redundant memory cell are connected to a subword line, a plurality of the subword lines being associated with one main word line.

* * * * *